United States Patent [19]

Terepin

[11] Patent Number: 4,633,386

[45] Date of Patent: Dec. 30, 1986

[54] DIGITAL SIGNAL PROCESSOR

[75] Inventor: Stephen Terepin, Farnborough, England

[73] Assignee: Schlumberger Measurement & Control (U.K.) Ltd., Farnboroug, England

[21] Appl. No.: 597,295

[22] Filed: Apr. 6, 1984

[30] Foreign Application Priority Data

Apr. 9, 1983 [GB] United Kingdom ............... 8309696

[51] Int. Cl.$^4$ ............................................. G06F 15/20
[52] U.S. Cl. .................................................... 364/200
[58] Field of Search ... 364/200 MS File, 900 MS File, 364/736

[56] References Cited

U.S. PATENT DOCUMENTS

4,511,966  4/1985  Hamada ............................ 364/200

Primary Examiner—Raulfe B. Zache
Attorney, Agent, or Firm—Dale Gaudier

[57] ABSTRACT

A digital signal processor (10) has a crossbar network (110) interconnecting a control and timing circuit (100), a multiplier (112), a serial access data memory (128), temporary storage registers (122, 124, 126), an accumulator (120) and input and output inerfaces (130, 132). Instructions in an external memory (12) are decoded by the control and timing circuit to cause the crossbar network to interconnect the other circuit elements in various patterns to feed selected signals from the input interface and stores to the multiplier, and the multiplier results to the stores and output interface. The sequence of interconnection patterns can be chosen to provide a selected signal processing function such as filtering. A multiplicand register (116) and a substitution circuit (118) enable the data to be modified in transit to implement other more complex signal processing functions.

7 Claims, 9 Drawing Figures

DIGITAL SIGNAL PROCESSOR

This invention relates to digital signal processors, and in particular to digital signal processors whose operation can be controlled by sequences of instructions provided by the user.

Until recently, most processing of analogue signals has been performed directly on those signals using analogue circuitry. Thus, the desired processing function, such as filtering or rectification, has been provided by combinations of electronic components such as resistors, capacitors, inductors and diodes with values and interconnections so arranged as to interact with the signal to produce the required result. The appropriate values and circuit arrangements are generally obtained by calculation using mathematical models of the effects of the components.

With the advent of cheap digital circuit components, an alternative approach has become feasible. In this, the analogue signal is first sampled and the magnitude of each sample is coded numerically (analogue-to-digital conversion). Then each numerical value is operated upon arithmetically in accordance with the mathematical model describing the desired signal processing function. The sequence of numerical results of the arithmetical operations can be converted back into a sequence of signal samples of corresponding magnitude (digital-to-analogue conversion), which then form a signal equivalent to that which would result from applying the original analogue input signal to an actual circuit defined by the mathematical model.

Various advantages arise from using such digital signal processing. The processing function obtained is precisely that desired, with no perturbations owing to tolerances in component values; thus several examples of the same signal processor will provide identical results.

The functions which can be obtained include many which, although definable mathematically, either cannot be produced using real electronic components or can only be produced with considerable difficulty and expense. Since the arithmetic operations required can be defined in terms of a program of instructions, the same general hardware can be made to perform many different signal processing functions by appropriate choice of the instruction sequence.

Known digital signal processors commonly take the form of a conventional (micro)computer, with, on a single integrated circuit chip, a memory to store the required instruction sequence and data, an arithmetic circuit, input and output circuits and a control unit to coordinate the processor's operations in accordance with the instruction program. To obtain a sufficiently high speed of operation for typical signal processing applications (such as in voice telecommunications systems), special additional circuitry is usually included: multiplication may be done by multipliers in hardware form; the program, data and any coefficients used by the program in manipulating the data may be stored in their own individual memories, and the buses or communication paths may be duplicated to prevent bottlenecks in the transfer of data between the various circuit elements. In addition, the program and coefficients are often stored in read-only memory forming part of the IC chip, with their values being permanently embodied (mask programmed) in the circuit structure during manufacture.

Although such an approach is satisfactory for certain applications (such as in voice telecommunications), it involves certain limitations. In particular, mask programming is only economical for large production quantities, and the number of binary digits making up a data value is typically no more than 16, with a consequent limit on the resolution and accuracy of the digital processing function.

According to one aspect of this invention there is provided a digital signal processor comprising:
 a serial access data memory having at least two data channels;
 multiplier means arranged to multiply at least three variables by respective coefficients and sum the products, including means arranged to detect overflow in the output signal of the multiplier means and substitute predetermined saturation values for said output signal;
 at least two shift registers;
 input interface means;
 output interface means;
 a crossbar switching network arranged selectively to interconnect the aforesaid circuit elements; and
 a control circuit arranged to respond to each of a plurality of predetermined instructions to control the crossbar network to interconnect the said circuit elements in corresponding predetermined ways, whereby a selected sequence of instructions supplied to the control circuit causes said circuit elements to be interconnected by the crossbar network in a selected sequence of ways chosen to effect a desired signal processing function.

The processor uses serial arithmetic techniques, permitting long wordlengths and associated high resolution. The highly parallel nature of the circuit arrangement enables the arithmetic circuits to be kept intensively active, and the provision of an individual (serial) data path for each circuit element avoids bottlenecks in data transfer.

The above-recited arrangement enables the implementation of a restricted range of signal processing functions; the inclusion of additional elements, such as an accumulator, another shift register (with independently addressable shift-out and shift-in locations) and other specialised registers increases the variety of functions that can be performed.

A digital signal processor in accordance with this invention for use as a programmable digital filter will now be described, by way of example, with reference to the accompanying drawings, in which.

The digital signal processor to be described is intended for use among other purposes as a general-purpose filter, that is to say the same component can be used to implement a variety of different filtering functions, the precise filter characteristic provided by the circuit in each case being dependent upon a sequence of instructions selected by the user. Typically the circuit would be implemented using large scale integrated circuit techniques.

Figure 1:
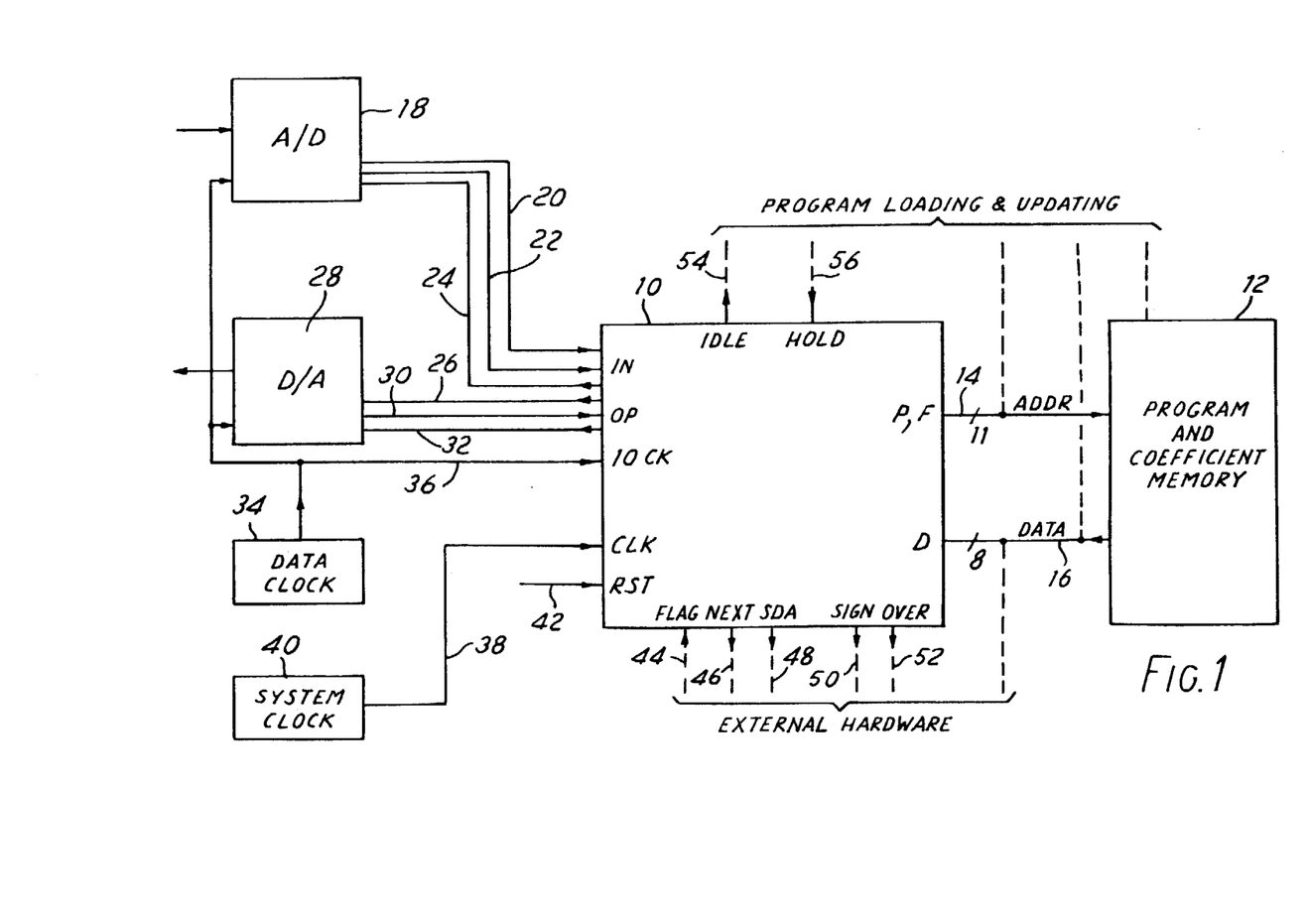
FIG. 1 is a schematic block diagram showing the processor in combination with typical external circuitry.

Referring to FIG. 1, the signal processor 10 is shown in combination with external memory 12 which may be random access memory (RAM) and/or (programmable) read only memoy (ROM or PROM). The processor 10 is coupled to the memory by an eleven-bit address bus 14, which carries signals specifying the address in the memory 12 of instructions controlling the operation of the processor 10 and of coefficients used during such operation. The value of the instruction or coefficient at the specified address is supplied by the memory 12 to the processor 10 along an eight-bit data bus indicated generally at 16.

Signals to be processed (already converted to digital form by a conventional analogue-to-digital converter 18) are supplied to the processor 10 along a serial input line 20, data transfers along this line being coordinated by handshaking signals on a data-ready line 22 and a data-request line 24. Processed signals are output from the processor 10 along a serial output line 26 (for example to a digital-to-analogue converter 28), with the data transfers likewise being controlled by signals on associated data-ready and data-request lines 30 and 32. The timing of both the input and the output signals is synchronised with the operation of the converters 18 and 28 by an external input/output clock signal supplied from a data clock circuit 34 on a line 36.

The timing of operations in the processor 10 itself is synchronised by another clock signal supplied on a line 38 from a system clock circuit 40. Initialisation of the processor circuitry is triggered by a signal applied on a reset line 42; typically this would be done in known manner when power is applied to the processor 10 (via connections not shown), with a signal derived from the power supply lines.

The remaining connections to the processor 10 may or may not be utilised, depending on the particular circuit in which the processor is being used. A flag input 44 can be tested to respond to a signal applied by external circuitry; a next-instruction output 46 is energised to indicate when the processor 10 is about to commence execution of the next instruction in the sequence stored in the memory 12—this could be used to control external memory selection circuitry; a data-available output 48 is energised to indicate when data intended for use by external circuitry is available on the data bus 16; and sign and overflow outputs 50 and 52 are energised to indicate in conventional manner the result of arithmetic operations within the processor 10.

The processor 10 must obviously complete the required processing steps for each input signal sample before the next sample becomes available. In practice, there would normally be some spare time between the end of processing for one sample and the occurrence of the next sample. During this spare time the processor 10 energises an idle output 54 to indicate that it is not actively processing, and thus not using the address and data buses 14 and 16. External circuitry can respond to this signal, if required, by energising a hold input 56, thereby suspending operation of the processor 10 and enabling the external circuitry to use the address and data buses 14 and 16 itself. This could be done, for example in the case of speech synthesis, where it would be desired to vary the coefficients used by the processor 10 and stored in the memory 12, between the processing sequences for successive input samples.

The construction and operation of the signal processor 10 will now be described in greater detail with reference to FIG. 2, which is a slightly simplified block diagram of the processor circuitry.

Figure 2:
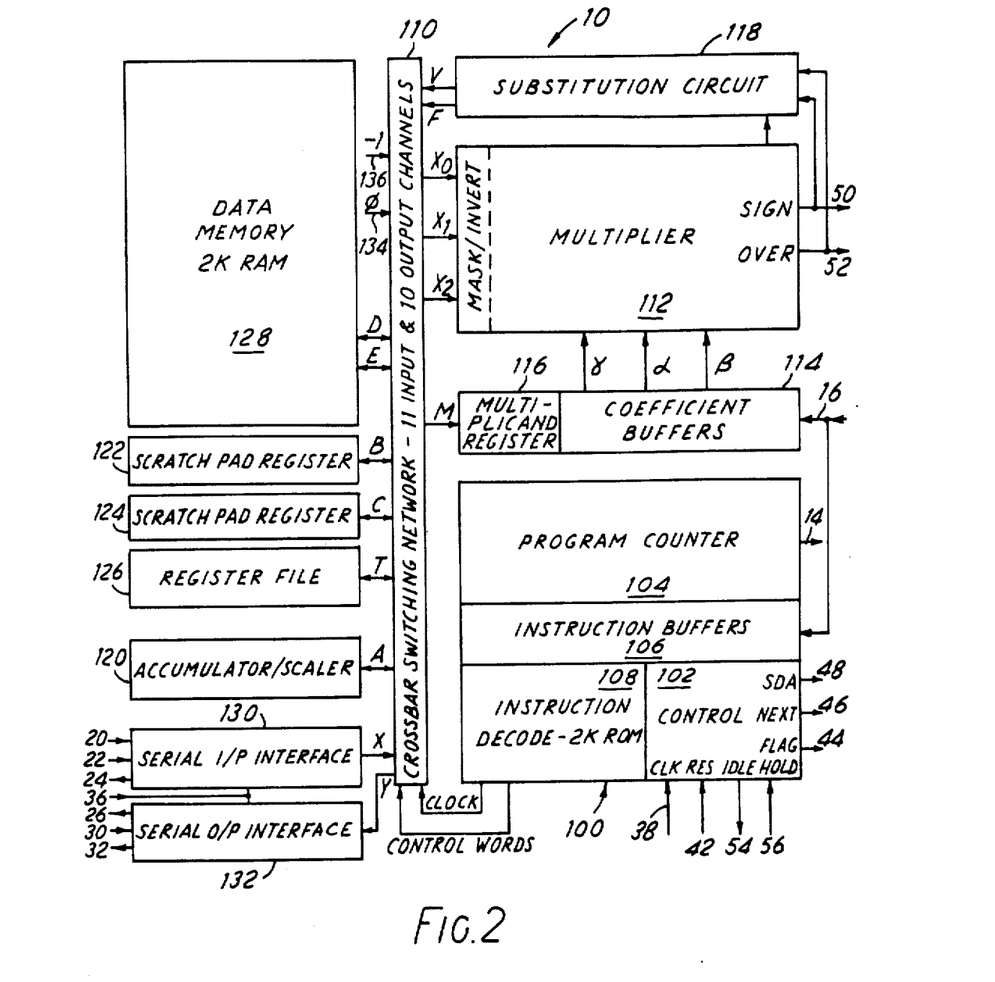
FIG. 2 is a simplified schematic block diagram showing the major circuit elements of the processor.
Figure 3:
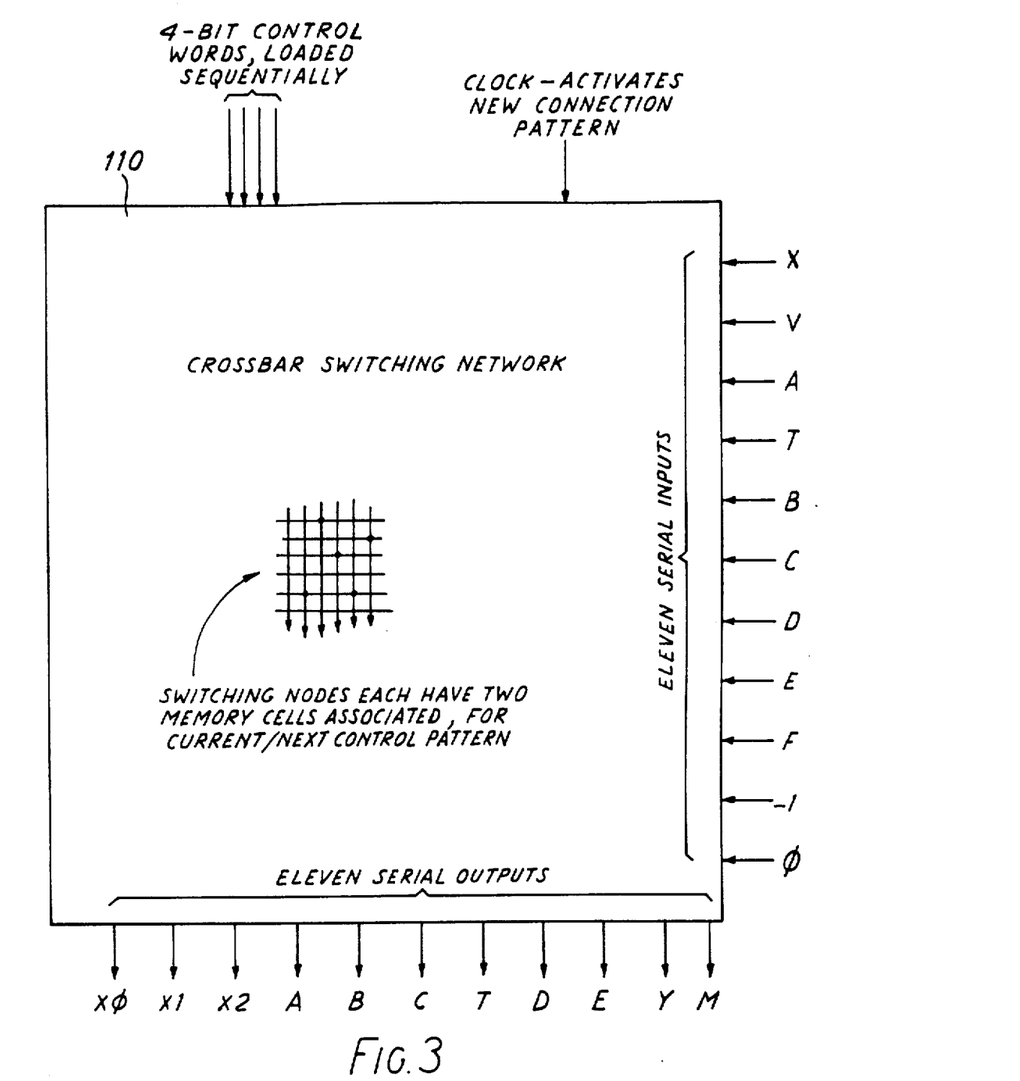
FIG. 3 is a schematic diagram of the crossbar network of FIG. 2.

Referring to FIG. 2, the operation of the processor 10 is coordinated by a control and timing circuit 100. This comprises a control circuit 102 which receives the system clock signal on the line 38, a program counter 104 which generates the memory address signals on the address bus 14, an instruction buffer 106 which receives the data representing instructions on the data bus 16 and an instruction decoder 108. This decoder, which can comprise a ROM programmed with the required control signals corresponding to each possible instruction, supplies the control signals to a crossbar switching network 110, which responds by selectively interconnecting the various circuit blocks or elements of the processor 10 in accordance with the particular combination of control signals. The crossbar network 110 has eleven inputs and eleven outputs, and is essentially a multiplexing circuit for coupling any input to any output. Thus, the network has one hundred and twenty-one switches arranged as an eleven-by-eleven array, and a memory cell associated with each switch to control the on/off state of that switch (see FIG. 3). The instruction decoder 108 supplies a four-bit control word for each of the eleven outputs, defining which of the eleven inputs is to be coupled to that output, by closing the appropriate one of the eleven switches for that output. For speed of operation, a double memory cell is provided for each switch, so that the set of control words defined by the next instruction can be loaded sequentially in one set of cells while the other cells are controlling the switches for the arrangement of interconnections specified by the current instruction. When a clock signal is applied to the crossbar network 110 by the control circuit 102, the new connection pattern for the next instruction can be immediately applied to the switches to produce the required interconnections. Thus the crossbar network applies the appropriate signals as inputs to the computation units in the processor 10, and directs the resulting output signals to various stores and registers, to be described hereinafter, as prescribed by each instruction received on the data bus 16.

One of the computation units is a multiplier 112 which is arranged to receive three input signals $X_0$, $X_1$ and $X_2$ and three coefficients $\alpha$, $\beta$ and $\gamma$, and to generate the triple product $$R=(X_0\times\gamma)+(X_1\times\alpha)+(X_2\times\beta)$$

The coefficients $\alpha$, $\beta$ and $\gamma$ are obtained from the memory 12 via the data bus 16 and coefficient buffers 114. As each instruction is obtained from the memory 12 and entered in the instruction buffer 106, the corresponding coefficients are loaded into the coefficient buffers 114. When a new interconnection pattern is produced by the crossbar network 110 in response to the instruction as described above, the values held in the buffers 114 are simultaneously applied to the multiplier 112. However, for one particular value of the $\gamma$ coefficient obtained from the memory 12, the actual $\gamma$ value is obtained instead from a multiplicand register 116, which is in turn loaded with value from other circuits in the processor 10 via the crossbar network 110. This makes it possible to implement such functions as adaptive filtering, correlation, modulation and squaring.

Furthermore, and under the control of the instruction decoder 108 and the sign of the 'source' data (identified as such in the instruction), each of the values $X_0$, $X_1$ and $X_2$ supplied by the crossbar network 110 to the multiplier 112 can be selectively masked (that is, replaced by zero) or inverted, enabling the implementation of full- and half-wave rectification and sign dependent gain.

The multiplier 112 is a serial/parallel circuit, in which the multiplications are carried out as the values $X_0$, $X_1$ and $X_2$ are supplied serially (bit-by-bit) but with all the bits of the coefficients available in parallel. These operations may be based, for example, upon the technique known as Booth's algorithm.

The output signal R from the multiplier 112 is supplied serially to a substitution circuit 118 which selectively alters the result as will be hereinafter described in dependence upon the instruction being executed, the sign of the value identified as the 'source' data, the sign of the result R and whether the result R has overflowed. This permits overflows to be corrected (by substituting the maximum permissible value, thereby providing the effect of saturation), and can be used for example to provide centre clipping and peak detection.

The output from the substitution circuit 118 comprises two signals: the final value V generated by execution of the instruction, and a feedback signal F. These signals are routed by the crossbar network 110 for storage and use during execution of succeeding instructions. For each instruction, the substitution circuit 118 generates these output signals serially as the multiplier 112 is receiving the signals involved in execution of the following instruction. Thus the value signal V can be supplied to another circuit for temporary storage, or cycled back to the multiplier 112 for immediate use in the instruction following that which generated it.

The other unit for performing computation is an accumulator 120; incoming data from the crossbar network 110 can either be added to or replace the existing contents of the accumulator 120. A shift function on the output of the accumulator enables the value to be scaled by a power of 2 (for example, between 1/64 and 256) as the contents are supplied to the crossbar network 110.

Intermediate values of the signal processing functions, and output values required during execution of subsequent instructions, can be stored in either of two scratch-pad registers 122 and 124, in a register file 126 or in a data memory 128.

Figure 4:
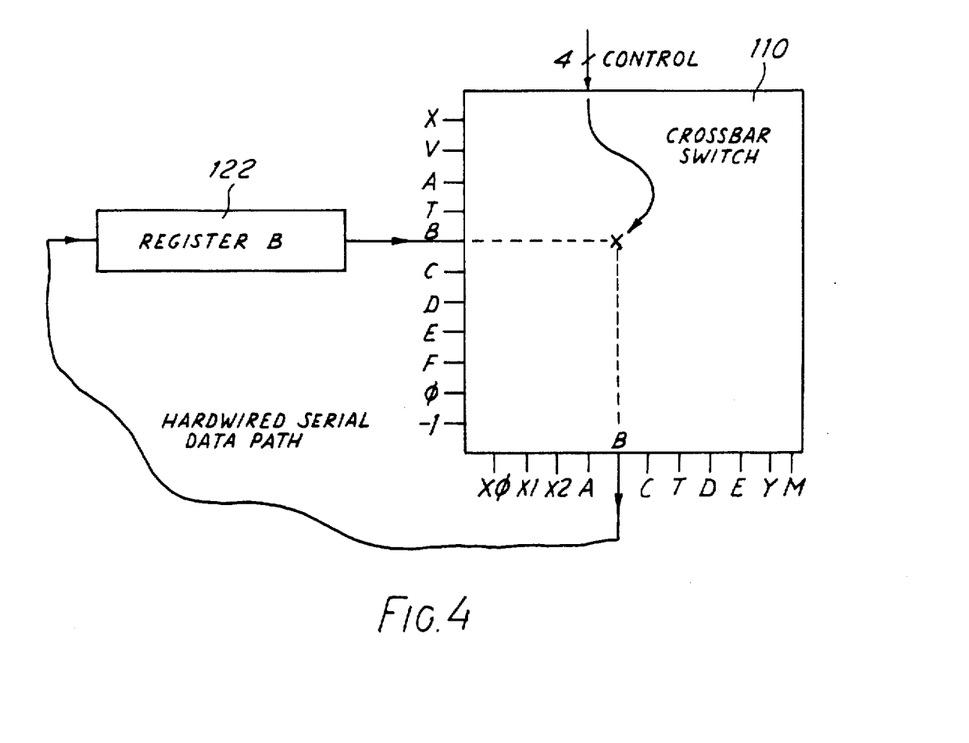
FIG. 4 is a schematic diagram illustrating a particular mode of operation of the crossbar network.

The scratch-pad registers 122 and 124 are essentially 32-bit shift registers, whose contents are clocked out serially to the crossbar network 110 for each instruction while data is clocked in from the associated output terminal of the network 110. If the contents of either register is not required for a particular instruction, the crossbar network can be switched to recirculate the contents of that register back into it (see FIG. 4).

The register file 126 can store four values simultaneously, and is also a form of shift register. However, it has the additional capability that the particular one of the four values to be read out and the particular one to be replaced by the incoming new data during execution of an instruction can be independently selected under the control of that instruction. Thus, unlike a normal shift register, reading out a value does not cause its loss, and the same value can be read out several times for use in several different instructions. In practice, the register file 126 can be implemented using RAM arranged to be accessed serially bit by bit.

Depending on the range of functions to be implemented with the processor 10, the register file 126 could have a larger capacity than 4 values, or a smaller capacity. In the limit, it could be capable of storing only a single value, in which case it would simply constitute a third scratch-pad register like the registers 122 and 124. However, the capability of storing several different and independently accessible values is of advantage.

The data memory 128 includes a 2 kilobit RAM organised to give a variable length delay before data applied to one of its two inputs appears at the respective output. The RAM is organised as two 32×32 arrays of storage cells, and the delay can be varied in increments of 32 bits: thus the RAM is equivalent to a dual channel shift register with a length which is a multiple of 32 bits. The delay provided by the memory 128 is controlled by the instruction decoder 108 in response to special instructions from the memory 12.

Although this serial arrangement restricts use of the processor 10 to processing algorithms which are compatible with serial memory access, it has the advantage of simplifying memory circuit control. In particular, the number of words in the memory 128 at any one time, and their length, are unimportant. The only important parameter is the required delay expressed as a number of bits.

The primary purpose of the memory 128 is to store the values of pairs of state variables associated with second-order filtering functions. The number of values which can be accommodated depends on the wordlength chosen (which in turn determines the resolution of the signal processing): for a 20-bit wordlength, up to 51 pairs of values can be stored, whereas for a 32-bit length only 32 pairs maximum can be stored.

More details of the design and operation of circuitry suitable for use in the multiplier 112 and the memory 128 can be found, for example, in the publication 'A bit serial VLSI architectural methodology for signal processing' by Richard F. Lyon, available from Xerox Palo Alto Research Center, 3333 Coyote Hill Road, Palo Alto, Calif., U.S.A., and in the references given therein.

The serial input and output lines 20 and 26 and their associated control and clock lines 22, 24, 30, 32 and 36 are connected to serial input and output interfaces 130 and 132. These provide buffering in conventional manner between the operation of the converters 18 and 28 and the operation of the internal circuitry of the processor 10. They may have two serial buffers each, so that they can transfer data to or from the converters 18 and 28 in synchronism with the data clock 34, and at the same time provide or receive data via the crossbar network 110 in synchronism with the system clock 40.

In addition to the connections to the various other circuit elements of the processor 10 shown in FIG. 2, the crossbar network 110 also has inputs 134 and 136 providing constant signals representative of values of zero and −1 respectively.

In operation, the instructions in the memory 12 are executed in sequence for each input sample received. Each instruction causes a particular pattern of interconnections between the circuit elements to be established, as described above, and the patterns thus selected and their sequence define the signal processing function effected by the processor 10.

Each instruction has an associated principal or 'source' input value for the function performed by that instruction. The actual origin within the processor of the source data will vary depending on the function being implemented. Thus in a cascade filtering function, the source data for the first instruction in the sequence would be the input sample value from the input interface 130, and the source data for each following instruction would be the result V from the previous instruction. In an arrangement comprising several biquadratic filtering functions in parallel, on the other hand, the input sample value would first be copied into the register file 126 and then repeatedly used as the source data for each instruction.

At each step in the instruction sequence the source data can be chosen to be any one of: the result V from the previous instruction step; the contents of the accumulator 120; a selected value from the register file 126; the contents of either of the scratch-pad registers 122 and 124; the contents of either channel of the serial access data memory 128; or the current sample value being input via the input interface 130. The values $X_0$, $X_1$ and $X_2$, and in some cases the source data, are selected implicitly by the particular instruction being executed.

Each instruction can also control the accumulator 120 to: take no action except retain its current contents; reset to zero; add the result value V to its present contents; load the value V in place of its present contents; add a selected value from the register file 126 to its present contents; load a selected value from the register file 126 in place of its current contents; load the current input sample value from the interface 130 in place of its present contents; or load the sum of that sample value and the result V from the previous instruction step, in place of its present contents.

Any selected location in the register file 126 can be loaded with any one of: the current result V; the contents of the accumulator 120; the contents of any selected location in the register file 126 itself; the contents of either of the scratch-pad registers 122 and 124 or either of the channels in the data memory 128; or the current input sample value from the interface 130. The multiplicand register 116 can likewise be loaded with any of these values, or retain its present contents.

The output interface 132 can be supplied with an output sample comprising any of these same values, except for the input sample value, and can also remain inactive.

It will be apparent that these options make it possible to implement a wide variety of signal processing functions by appropriate selection of the interconnection patterns and their sequence. By way of example, two specific filter functions will be described to illustrate the operation of the processor 10.

Figure 5A:
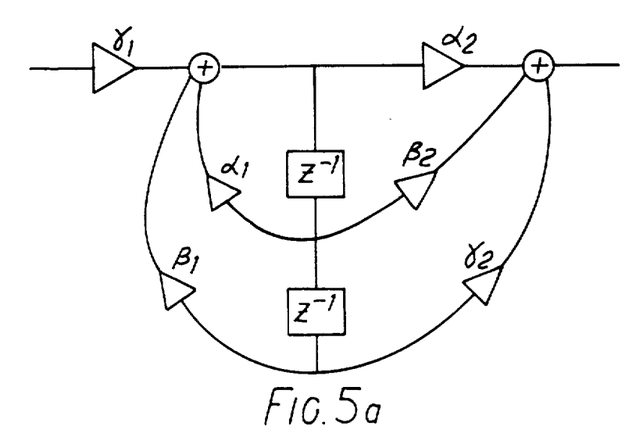
FIGS. 5a and 5b are schematic diagrams illustrating a biquadratic filter function and its implementation with the processor.

The first example is a biquadratic filter function, used as a building block for many filters including high-pass, low-pass and band-pass filters, and shown diagrammatically in FIG. 5a using standard digital signal processing notation. This can be implemented by the processor 10 with an iterative instruction cycle containing two instructions, the first of which uses intermediate results from previous iterations.

During the first instruction, the crossbar network 110 establishes the following connections, to commence calculating a new value and also to output the sample value calculated in the previous iteration:

| Input | Output |
|-------|--------|
| X | $X_0$ |
| D | $X_1$ |
| E | $X_2$ |
| A | A |
| D | B |
| E | C |
| T | T |
| D | D |
| E | E |
| V | Y |
| — | M |

Thus the input sample is multiplied by $\gamma_1$, the intermediate result from the previous iteration (held in the data memory 128) is multiplied by $\alpha_1$, and the intermediate result from the iteration before that (also in data memory 128) is multiplied by $\beta_1$; $\alpha_1$, $\beta_1$ and $\gamma_1$ having been supplied by the memory 12. At the same time these earlier intermediate results are copied into the scratch-pad registers 122 and 124 for use during the second step of the iteration.

In this second step, the actual output sample value is calculated, the crossbar network 110 making the following connections:

| Input | Output |
|-------|--------|
| C | $X_0$ |
| B | $X_1$ |
| V | $X_2$ |
| A | A |
| B | B |
| C | C |
| T | T |
| V | D |
| B | E |
| — | Y |
| — | M |

The intermediate result V from the first instruction is both multiplied by $\beta_2$ and fed into the data memory 128 for use in the next iteration, the intermediate result from the previous iteration is multiplied by $\alpha_2$ and also fed back into the data memory 128, and the intermediate result from the iteration before that is multiplied by $\gamma_2$.

The new result from the multiplier 112 is fed into the substitution unit 118, from which it will emerge as the value V to be fed to the output interface 132 during the first instruction of the following iteration.

Figure 5B:
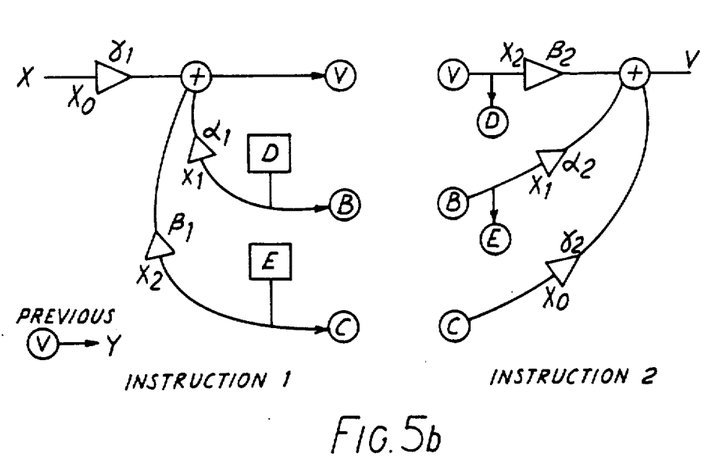

In effect the first instruction of each iteration implements the poles of the filter characteristic, while the second implements the zeros of the characteristic (see FIG. 5b). The actual filter values, such as bandwidth and centre frequency of the pass-band, are determined by the values of the coefficients $\alpha$, $\beta$ and $\gamma$ used in each instruction. The $\gamma$ coefficient in this case is simply used as a scaling or gain factor. The values $\alpha$ and $\beta$ for the first instruction would be computed from the formulae:

$$\alpha_1 = -2r \times \cos\theta,$$

$$\beta_1 = -r^2$$

and for the second instruction $$\alpha_2 = +2r \times \cos\theta,$$

$$\beta_2 = +r^2.$$

In both cases $$\theta = 2\pi f/F_s$$

and $$r = e^{-\pi \times b/F_s}$$

where
f is the desired centre frequency:
$F_s$ is the frequency at which the input signal is sampled by the converter 18; and
b is the desired bandwidth.

Figure 6A:
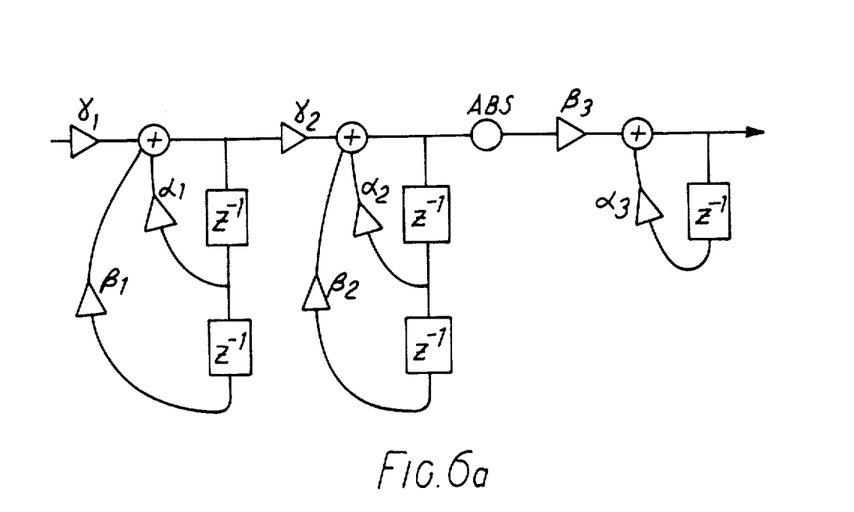
FIGS. 6a and 6b are schematic diagrams illustrating an all-pole filtering and smoothing function and its implementation with the processor.
Figure 6B:
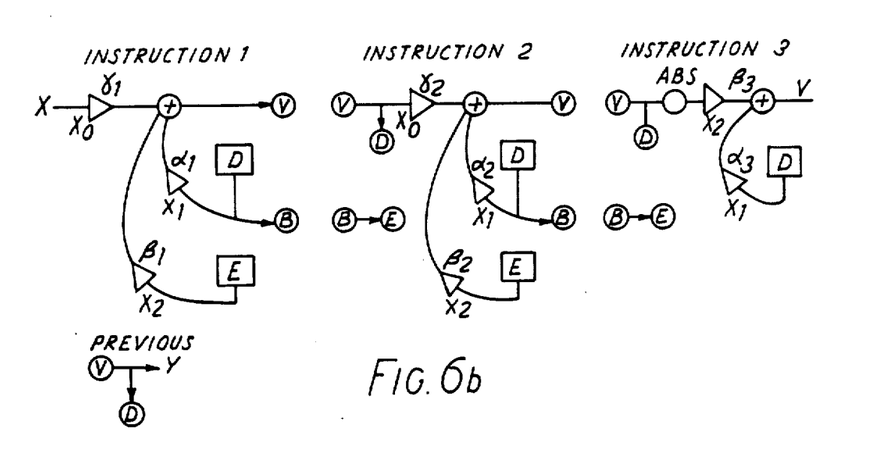

The second example is an all-pole bandpass filter followed by a rectifier and smoothing circuit, as shown in FIG. 6a. This requires three instructions for its implementation, the first of which causes the crossbar network to establish the following connections:

| Input | Output |
|-------|--------|
| X | $X_0$ |
| D | $X_1$ |
| E | $X_2$ |
| A | A |
| D | B |
| C | C |
| T | T |
| V | D |
| Don't care | E |
| V | Y |
| — | M |

The first intermediate value is calculated from the input sample, the two corresponding previous intermediate values (held in the data memory 128) and the coefficients $\alpha_1$, $\beta_1$ and $\gamma_1$ for this instruction, as for the first example above. At the same time, the result from the previous iteration is supplied to the output interface 132, and is also fed to the data memory 128 for temporary storage. The corresponding intermediate value from the previous iteration is (temporarily) moved to the scratch-pad register 122 as a preliminary to placing it back in the data memory 128 for use in this first instruction in the following iteration.

The second instruction sets up a connection pattern very similar to the first:

| Input | Output |
|-------|--------|
| V | $X_0$ |
| D | $X_1$ |
| E | $X_2$ |
| A | A |
| D | B |
| C | C |
| T | T |
| V | D |
| B | E |
| — | Y |
| — | M |

The main differences are that $X_0$ is now the intermediate result from the first instruction, and the data memory 128 receives the previous first intermediate result ready for use in the first instruction of the next iteration while the register 122 receives the new intermediate result, also for subsequent transfer to the data memory 128.

The third instruction completes the iteration: as well as setting up the required interconnections in the crossbar network 110, the instruction decoder 108 causes the multiplier 112 to invert selectively the signal received on its $X_2$ input (the intermediate result of the second instruction), to generate the absolute value: this implements the rectification function. The connections are:

| Input | Output |
|-------|--------|
| V | $X_0$ |
| D | $X_1$ |
| V | ABS $X_2$ |
| A | A |
| B | B |
| C | C |
| T | T |
| V | D |
| B | E |
| — | Y |
| — | M |

The final result is supplied to the output interface 132 and stored in the data memory 128 during the first instruction of the next iteration. The $\gamma_3$ coefficient for the $X_0$ input is set to 0 (zero) for the third instruction since the $X_0$ input signal is not required during this instruction.

The values of the three coefficients are chosen appropriately for the three instructions to produce the desired filter characteristics. For the first two instructions they are derived from the required filter frequency, gain and bandwidth as for the first (poles) instruction of the biquadratic filter function. For the third instruction $\alpha_3$ is equal to $-r$, while $\beta_3$ is the required gain of the lowpass smoothing stage.

If it were desired to implement a squaring function in the final stage of the second example, as an alternative to full-wave rectification, the multiplicand register 116 could be used. The second instruction would be modified to load this register (the M output of the crossbar network 110) from the data memory 128 (D input of the network 110). Thus for the third instruction the scratch-pad register 122 (B) and the multiplicand register 116 would contain the same delayed intermediate result from the second instruction of the preceding iteration. In the third instruction, the $X_0$ input of the multiplier 112 would be coupled to receive the contents of the scratch-pad register 122 (B), the $\gamma_3$ value would be the special value causing the contents of the multiplicand register 116 to be substituted for the $\gamma$ coefficient, and $\beta_3$ would be set to 0 to suppress the effect of the $X_2$ input. Thus the equal values in the scratch-pad register 122 and the multiplicand register 116 would be multiplied together, yielding the square of their contents. It should be noted that this modification would result in the output signal from the iteration being delayed by the duration of one iteration as compared to the unmodified process.

The above examples assume that the delay in the data memory 128 has been appropriately set: in the first case this delay would be one instruction period, while in the second example it would be two instruction periods.

Most of the circuit elements shown in FIG. 2 and described above are based on known logic circuit techniques and designs, so they can readily be constructed by a person skilled in the art. However, the substitution circuit 118 is a specialised design and will therefore be described in further detail with reference to FIG. 7.

Figure 7:
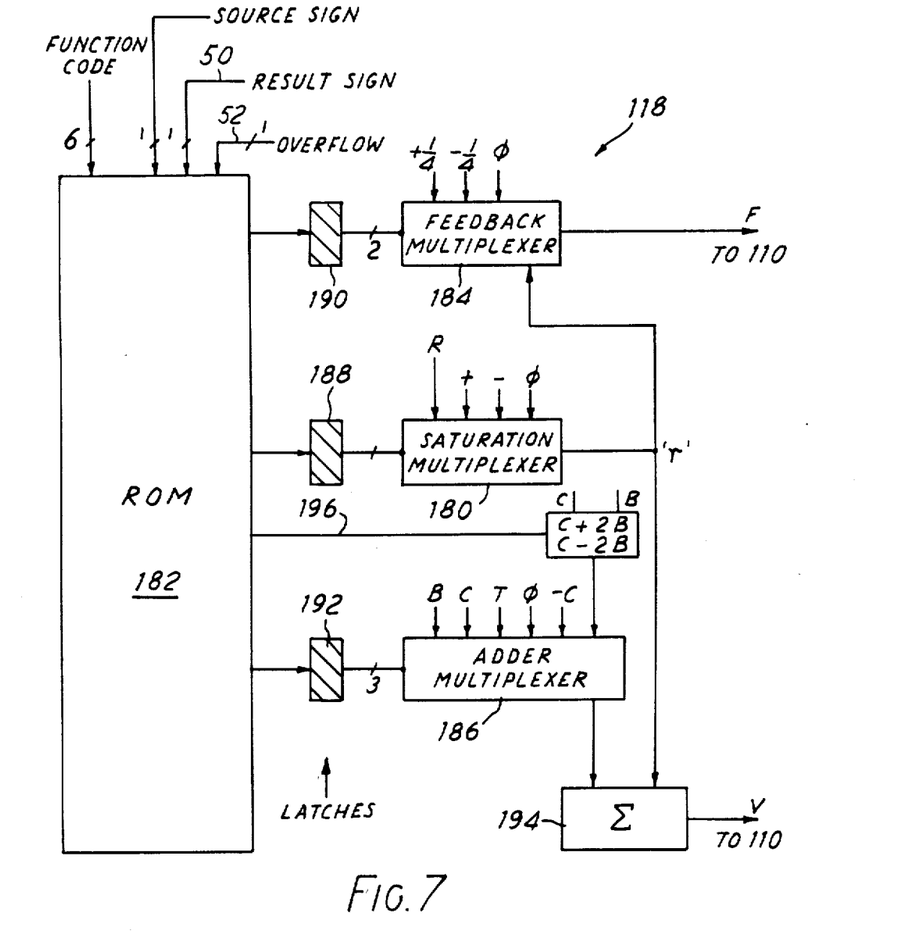
FIG. 7 is a schematic block diagram of the substitution circuit of FIG. 2.

Referring to FIG. 7, the result from the multiplier 112 is supplied to one input of a four-to-one multiplexer 180 which provides the saturation function. The other inputs to this multiplexer are constant signals representing +1, −1 and 0. The control input of the multiplexer 180 is controlled by output signals from a ROM 182 which receives as input signals the part of the instruction from the memory 12 defining the function implemented by that instruction (that is, the part which also controls the crossbar network 110), signals indicating the sign of the value supplied as the 'source' data, the sign of the result produced by the multiplier 112 (line 50), and the overflow signal (line 52). The ROM 182 is loaded with control signals corresponding to each possible combination of the sign and overflow flags for each instruction, for supply to the saturation multiplexer 180 and to two other multiplexers 184 and 186, to select which of their input signals is coupled to their outputs. Thus each particular pattern of flag signals applied to the ROM 182 for each possible instruction results in a particular corresponding selection of the inputs of the multiplexers 180, 184 and 186. The control signals from the ROM 182 are supplied to the multiplexers 180, 184 and 186 via respective latches 188, 190 and 192.

The (four-to-one) multiplexer 184, which produces the feedback signal F, receives at its inputs the output of the multiplexer 180 and three constant signals representing $+\frac{1}{4}$, $-\frac{1}{4}$ and 0. The (six-to-one) multiplexer 186, which supplies its output signal to a serial adder 194, receives at its inputs the contents of the scratch-pad registers 122 and 124, the contents of the register file 126, the complemented contents of the scratch-pad register 124, the contents of the scratch-pad registers 122 and 124 combined according to either C+2B or C−2B depending on a control signal on a line 196 from the ROM 182, and a constant signal representing 0.

The serial adder combines the output signal from the adder multiplexer 186 with that from the saturation multiplexer 180 to produce the actual value constituting the result of execution of an instruction by the processor 10. This value is fed to the crossbar network 110 after execution of the instruction, as the multiplier 112 outputs its result and receives new data for the next instruction.

The primary purpose of the substitution circuit 118 is to correct overflows by substituting saturation values of −1 or −1 as appropriate. Thus, if the overflow flag is clear (no overflow), the multiplier result is selected by the saturation multiplexer 180 and 0 is selected by the adder multiplexer 186, so the adder 194 supplies the multiplier result unaltered. However, if the overflow flag is set, the saturation multiplexer 180 substitutes +1 or −1 for the multiplier result, according to the result's sign, and this value is output by the adder 194 instead. In either case, the feedback multiplexer 184 selects the output signal of the saturation multiplexer 180.

Another example of the use of the substitution unit 118 is to implement zero crossing detection. The unit's operation is summarised in the following table:

| Source Sign | Result Sign | Overflow | Multiplexers |  |  |
|---|---|---|---|---|---|
|  |  |  | 180 | 186 | 184 |
| + | + | x | 0 | 0 | $+\frac{1}{4}$ |
| − | + | x | −1 | 0 | $-\frac{1}{4}$ |
| + | − | x | +1 | 0 | $+\frac{1}{4}$ |
| − | − | x | 0 | 0 | $-\frac{1}{4}$ |

As long as the source and result signs are the same, no output is produced, but a small value having the same sign is fed back and summed with the next input sample. If the source and result signs differ (indicating a zero crossing), the saturation multiplexer 180 selects +1 or −1 so as to give an output signal, chosen in accordance with the source signal sign. Thus a positive-going change results in a positive pulse as the output signal, and a negative-going change results in a negative pulse.

If it is required to implement a biquadratic filter function with zeroes at Z=+1 and −1, for which α=0 and β=+1, the substitution circuit 118 can be used to reduce the number of instructions from two to one. After the multiplier 112 has done the computation for the poles of the filter characteristic (see the first instruction in the first example above), the adder multiplexer 186 would be controlled by the ROM 182 to select the signal from the scratch-pad register 124 (C), and this would be added to the multiplier result (via the multiplexer 180) by the serial adder 194 to produce immediately the final output value including the two zeroes. At the same time, the feedback multiplexer 184 would be controlled to select the multiplier result itself (via the multiplexer 180) to be fed back to the data memory 128 for use in the following iteration.

Many different applications of the processor 10, using various combinations of interconnection patterns, will occur to those skilled in the digital signal processing art, in view of the considerable flexibility in operation which it provides; for example, recursive filters (both parallel and cascade forms), ladder filters with or without taps, finite impulse response filters and decimators. In addition, modifications and developments may be made; thus, for example, the various registers and memories may have wordlengths chosen for the required degree of resolution, or they may have variable wordlengths, the length in any given case being specified by instructions in the memory 12. In this latter case, a pair of variable-length shift registers would be included in series with the RAM in the data memory 128 to provide additional selectable delays in steps of 4 bits from 0 up to 28 bits to allow the word to be adjusted in increments of 4 bits.

What is claimed is:

1. A digital signal processor comprising:
   (a) signal processor circuit elements comprising:
      a serial access data memory having at least two data channels;
      multiplier means arranged to multiply at least three variables
      by respective coefficients and sum the products, including means arranged to detect overflow in an output signal of the multiplier means and substitute predetermined saturation values for said output signal;
      at least two shift registers;
      input interface means;
      output interface means;
   (b) a crossbar switching network arranged selectively to interconnect said circuit elements; and
   (c) a control circuit arranged to respond to each of a plurality of predetermined instructions to control the crossbar network to interconnect said circuit elements in corresponding predetermined ways, whereby a selected sequence of instructions supplied to the control circuit causes said circuit elements to be interconnected by the crossbar network in a selected sequence of ways chosen to effect a desired signal processing function.

2. A processor according to claim 1, including at least one accumulator coupled to said switching network.

3. A processor according to claim 1, including a third shift register coupled to said switching network.

4. A processor according to claim 3, wherein one of said shift registers is arranged to store a plurality of values, the location of a value to be shifted out being selectable independently of the location to receive a new value to be shifted in.

5. A processor according to claim 1, wherein said detection and substitution means is also arranged to detect the sign of source and result data signals, and to alter the multiplier output signal in accordance with the combination of overflow and sign signals detected and the instruction being executed.

6. A processor according to claim 1, wherein said multiplier means includes input circuit means arranged selectively to invert or replace with zero the value supplied thereto.

7. A processor according to claim 1, wherein said coefficients are stored in memory means coupled to said control circuit and said multiplier means, and including a register connected to said crossbar network to receive a value from said circuit elements and arranged selectively to replace the value of a coefficient supplied from said memory therewith.

* * * * *